United States Patent
Grimes et al.

(10) Patent No.: US 10,655,217 B2
(45) Date of Patent: May 19, 2020

(54) METHOD OF FORMING A PASSIVATION LAYER ON A SUBSTRATE

(71) Applicant: SPTS TECHNOLOGIES LIMITED, Newport (GB)

(72) Inventors: Michael Grimes, San Jose, CA (US); Yuyuan Lin, San Jose, CA (US)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 15/968,433

(22) Filed: May 1, 2018

(65) Prior Publication Data
US 2019/0338414 A1    Nov. 7, 2019

(51) Int. Cl.
| | | |
|---|---|---|
| *C23C 16/02* | (2006.01) | |
| *B05D 1/00* | (2006.01) | |
| *C23C 16/40* | (2006.01) | |
| *C23C 16/44* | (2006.01) | |

(Continued)

(52) U.S. Cl.
CPC ............ *C23C 16/0272* (2013.01); *B05D 1/60* (2013.01); *C23C 16/0254* (2013.01); *C23C 16/40* (2013.01); *C23C 16/4408* (2013.01); *C23C 16/45525* (2013.01); *H05K 3/282* (2013.01);

(Continued)

(58) Field of Classification Search
CPC . C23C 16/0272; C23C 16/0254; C23C 16/40; C23C 16/4408; C23C 16/45525; B05D 1/60

See application file for complete search history.

(56) References Cited

U.S. PATENT DOCUMENTS 7,023,508 B2 *   4/2006   You .................. G02F 1/133555
                                                                257/59
8,624,288 B2 *   1/2014   Jang .................. H01L 33/0079
                                                                257/98

(Continued)

FOREIGN PATENT DOCUMENTS

CN        104517893 A        4/2015

OTHER PUBLICATIONS

Krokoszinski, H.-J., et al., "An inorganic-organic passivation double layer for thin film circuits". Thin Solid Films, vol. 135, Issue 1, Jan. 2, 1986, pp. 1-8.*

(Continued)

*Primary Examiner* — Bret P Chen
(74) *Attorney, Agent, or Firm* — Hodgson Russ LLP (57) ABSTRACT

A method of forming a passivation layer on a substrate includes providing a substrate in a processing chamber. The substrate includes a metallic surface which is a copper, tin or silver surface, or an alloyed surface of one or more of copper, tin or silver. The method further includes depositing at least one organic layer onto the metallic surface by vapour deposition, the organic layer formed from an organic precursor. The organic precursor includes a first functional group including at least one of oxygen, nitrogen, phosphorus, sulphur, selenium, tellurium, or silicon, and a second functional group selected from hydroxyl (—OH) or carboxyl (—COOH). The first functional group is adsorbed onto the metallic surface. The method further includes depositing at least one inorganic layer onto the organic layer by vapour deposition, wherein the second functional group acts as an attachment site for the inorganic layer.

22 Claims, 3 Drawing Sheets

(51) Int. Cl.
 *C23C 16/455* (2006.01)
 *H05K 3/28* (2006.01)
(52) U.S. Cl.
 CPC ....... *H05K 3/288* (2013.01); *H05K 2203/124* (2013.01)

(56) References Cited

U.S. PATENT DOCUMENTS

| | | | | |
|---|---|---|---|---|
| 2003/0143319 | A1* | 7/2003 | Park | C23C 16/45525 427/64 |
| 2009/0215279 | A1* | 8/2009 | Kim | H01L 51/448 438/763 |
| 2011/0097821 | A1* | 4/2011 | Sirard | H01L 21/3105 438/4 |
| 2011/0121280 | A1* | 5/2011 | Hakii | C23C 18/1608 257/40 |
| 2011/0284957 | A1* | 11/2011 | Tamaki | H01L 23/544 257/339 |
| 2012/0161231 | A1* | 6/2012 | Tamaki | H01L 24/05 257/335 |
| 2014/0110779 | A1* | 4/2014 | Tamaki | H01L 29/66727 257/330 |
| 2014/0191309 | A1* | 7/2014 | Eguchi | H01L 29/0619 257/329 |
| 2015/0070612 | A1* | 3/2015 | Seo | G02F 1/133514 349/43 |

OTHER PUBLICATIONS

Woo Jin Kim et al, "Organic/inorganic hybrid passivation layers for organic thin-film transistors". Semicond. Sci. Technol. 23 075034, 2008, pp. 1-4.*

Bermundo, Juan Paolo, et al., "Highly reliable photosensitive organic-inorganic hybrid passivation layers for a-InGaZnO thin-film transistors". Applied Physics Letters 107, 033504 (2015), pp. 1-5.*

Itoh, M., H. Nishihara, and K. Aramaki, A Chemical Modification of Alkanethiol Self-Assembled Monolayers with Alkyltrichlorosilanes for the Protection of Copper Against Corrosion. Journal of The Electrochemical Society, 1994. 141 (8): p. 2018-2023.

Itoh, M., H. Nishihara, and K. Aramaki, The Protection Ability of 11-Mercapto-1-undecanol Self-Assembled Monolayer Modified with Alkyltrichlorosilanes Against Corrosion of Copper. Journal of the Electrochemical Society, 1995. 142(6): p. 1839-1846.

Haneda, R., H. Nishihara, and K Aramaki, Chemical Modification of an Alkanethiol Self-Assembled Layer to Prevent Corrosion of Copper. Journal of the Electrochemical Society, 1997. 144(4): p. 1215-1221.

Haneda, R. and K. Aramaki, Protection of Copper Corrosion by an Ultrathin Two-Dimensional Polymer Film of Alkanethiol Monolayer. Journal of the Electrochemical Society, 1998. 145(6): p. 1856-1861.

Haneda, R. and K. Aramaki, Protective Films on Copper by Multistep Modification of an Alkanethiol Monolayer with Chlorosilanes and Alkanediol. Journal of the Electrochemical Society, 1998. 145(8): p. 2786-2791.Bonner, R.W., et al. Passivation coatings for micro-channel coolers. in 2012 Twenty-Seventh Annual IEEE Applied Power Electronics Conference and Exposition (APEC). 2012.

Bonner, R.W., et al. Passivation coatings for micro-channel coolers. in 2012 Twenty-Seventh Annual IEEE Applied Sower Electronics Conference and Exposition (APEC). 2012.

Flannery et al., "Nanoscale coatings for erosion and corrosion protection of copper microchannel coolers for high powered laser diodes," High-Power Diode Laser Technology and Applications XII, vol. 8965, p. 896505, 2014.

Li et al, "Atomic layer deposition of aluminum oxide on carboxylic acid-terminated self-assembled monolayers," Langmuir, vol. 25, 1911-1914, 2009.

Vericat et al., "Self-assembled monolayers of thiolates on metals: a review article on sulfur-metal chemistry and surface structures," RSC Advances, vol. 4, 27730-27754, 2014.

Worley et al., "Anodic Passivation of Tin by Alkanethiol Self-Assembled Monolayers Examined by Cyclin Voltammetry and Coulometry," Langmuir, vol. 29, 12969-12981, 2013.

EPO, Extended European Search Report for EP19172139.8, dated Jan. 10, 2020.

* cited by examiner

METHOD OF FORMING A PASSIVATION LAYER ON A SUBSTRATE

BACKGROUND

This invention relates to a method of forming a passivation layer on a substrate. The invention relates also to a substrate comprising a passivation layer formed by the aforementioned method. The invention further relates to a method of removing a passivation layer from a substrate.

Many metals are susceptible to oxidation when exposed to or stored in atmospheric conditions. Oxidation of metals causes a metal oxide to form on the surface of the metal. The formation of surface metal oxides can have detrimental effects on the chemical, mechanical, optical and electrical properties of the metal. For these reasons, metal oxides are typically removed from metallic surfaces prior to forming an electrical connection. However, metal oxides may grow to beyond nanometre levels, and can be difficult and time consuming to remove. It is therefore desirable to prevent the formation of surface metal oxides.

A known approach for preventing the formation of surface metal oxides includes forming a passivation layer. A "passivation layer" is a protective film, layer or coating deposited on the surface of a substrate to suppress or inhibit chemical reactions, such as oxidation reactions, occurring at that surface. A passivation layer typically acts as an oxidation barrier layer, which inhibits oxidation of the underlying surface. In the case of a metallic surface, such as a copper surface, a passivation layer inhibits the oxidation of the metallic surface, and thereby prevents corrosion.

Some known passivation layers are permanent. For example, it is known to deposit alumina directly onto a metallic surface to suppress oxidation. However, removal of such a permanent passivation layer typically requires aggressive chemical etching, mechanical polishing or other processes which could damage other components of the substrate.

In some applications, such as PCB surface finishes or thermo-compression bonding, a temporary passivation layer is preferred. It is desirable to be able to selectively remove the passivation layer as required in preparation for subsequent processing steps. For example, it may be necessary to remove the passivation layer prior to forming an electrical connection in the fabrication of an electronic device.

When forming electrical connections, it is known to deposit a layer of organic solderability preservative (OSP) on a surface of a metal, such as copper, prior to soldering. The OSP layer inhibits oxidation of the metallic surface prior to soldering and acts as a passivation layer.

The OSP passivation layer must be of a minimum thickness to sufficiently suppress oxidation of the underlying metallic surface (usually several 100 nm), and can contaminate the substrate in subsequent processing steps. Known methods of depositing OSP layers typically result in the OSP layer having a non-uniform thickness across the substrate surface. Thick and/or non-uniform OSP layers may be difficult to fully remove and OSP residues may contaminate the substrate during subsequent processing steps.

It is desirable to decrease the thickness of a passivation layer, whilst preserving the oxidation resistant characteristics of the passivation layer. It is desirable for the passivation layer to have improved thickness uniformity. It is desirable to develop a passivation layer that can suppress or inhibit oxidation over a prolonged period, such as in storage, but which can be selectively removed from a substrate when desired. It is desirable to be able to selectively remove passivation layers without the need to use additional processing steps, such as aggressive chemical etching or mechanical polishing.

Alternative passivation coatings are also known, for example a passivation coating for micro-channel coolers is disclosed in R. W. Bonner III et al, *Applied Power Electronics Conference and Exposition (APEC)*, 2012, 498-502. Bonner III et al. disclose a copper substrate where corrosion prevention is primarily controlled by plating layers of nickel and gold onto the copper substrate. A long-chain alkanethiol is used to form a self-assembled monolayer (SAM) on the polished gold surface, and subsequently an alumina layer is deposited thereon. Longer carbon chains are preferred because longer chained SAM molecules pack and organize better than shorter chain SAM molecules. The passivation coating of Bonner helps to aid erosion protection.

SUMMARY

The present invention in at least some of its embodiments, seeks to address some of the above described problems, desires and wants. The present invention, in at least some of its embodiments, provides a method for forming a passivation layer that inhibits oxidation of an underlying metallic surface over a prolonged period of time, whilst reducing the required thickness of the passivation layer. The method can also improve the uniformity of the passivation layer. The present invention, in at least some of its embodiments, also provides a method for forming a passivation layer that is selectively degradable and/or removable, at least partially, from a surface, as desired by a user.

According to a first aspect of the invention there is a method of forming a passivation layer on a substrate, the method comprising the steps of:

a) providing a substrate in a processing chamber, the substrate comprising a metallic surface, wherein the metallic surface is a copper, tin, or silver surface, or an alloyed surface comprising one or more of copper, tin or silver;

b) depositing at least one organic layer onto the metallic surface by vapour deposition, the organic layer formed from an organic precursor comprising:

a first functional group comprising at least one of: oxygen, nitrogen, phosphorus, sulphur, selenium, tellurium, or silicon; and a second functional group selected from hydroxyl (—OH) or carboxyl (—COOH);

wherein the first functional group is adsorbed onto the metallic surface; and c) depositing at least one inorganic layer onto the organic layer by vapour deposition, wherein the second functional group acts as an attachment site for the inorganic layer.

The passivation layer comprises the organic layer and the inorganic layer. Such a passivation layer suppresses or inhibits the oxidation of the underlying metallic surface at room temperature for a prolonged period of time. However, the passivation properties of the passivation layer may be degraded as desired by a user. The passivation layer may undergo a change of state at an elevated temperature so that the passivation properties of the passivation layer are degraded. For example, the passivation layer may at least partially decompose, degrade or desorb from the metallic surface at an elevated temperature. The passivation layer may be removed at least partially under mechanical stress. It is preferable for the passivation layer to undergo a change in state, such as by degrading, desorbing or decomposing, at a temperature lower than the temperature of soldering or thermo-compression bonding. In this way the passivation properties of the passivation layer degrade during a soldering process, which ensures no oxide can form prior to the electrical connection being formed. However, if the degradation temperature is too high, other components of the substrate may become damaged. The passivation layer may at least partially decompose or degrade at a temperature between 100° C. and 260° C. Optionally, the passivation layer may at least partially decompose or degrade at a temperature between 100° C. and 150° C., optionally between 150° C. and 200° C., and optionally between 200° C. and 260° C. The first functional group may desorb from the metallic surface at a temperature between 100° C. and 260° C. Optionally, the first functional group may desorb from the metallic surface at a temperature between 100° C. and 150° C., optionally between 150° C. and 200° C., and optionally between 200° C. and 260° C. The passivation layer may be removed at a temperature between any combinations of the limits of the temperatures provided above.

A passivation layer comprising the organic layer and the inorganic layer provides a stable and effective gas permeation barrier at room temperature, thereby inhibiting oxidation and corrosion of the metallic surface.

The passivation layer of the present invention is suitable for passivating a copper, tin or silver surface (or an alloyed surface comprising one or more of copper, tin or silver) without the need for additional protective metallic layers, such as gold. This advantageously removes processing steps and minimises processing a material costs.

The use of vapour deposition techniques for steps b) and c) beneficially allows the organic layer and inorganic layer to be deposited on a surface having a high aspect ratio, such as an aspect ratio of at least 10:1, preferably at least 100:1. The organic layer and inorganic layer may be deposited with improved uniformity on the metallic surface using molecular vapour deposition and atomic layer deposition respectively.

The first functional group may be selected from the group: carboxyl (—COOH), primary amine (—NH$_2$), secondary amine, tertiary amine, thiol (—SH), diazole, triazole, disulphide, isocyanate, phosphonate, organoselenium, organotellurium, or organosilane.

The first functional group may be a primary, secondary or tertiary functional group.

The first functional group may chemisorb onto the metallic surface. Chemisorption may provide a temporary attachment means between the first functional group and the metallic surface. Chemisorption may provide a sufficiently strong interaction with the metallic surface to provide a stable passivation layer at room temperature for extended periods of time. Chemisorption may provide a passivation layer that is temperature sensitive so that the passivation layer is removable at elevated temperatures. Chemisorption may facilitate the removal of the passivation layer from the metallic surface at an elevated temperature.

The organic precursor may have a structure of the form:

wherein X is the first functional group; R is substituted or unsubstituted alkyl, substituted or unsubstituted cycloalkyl, or substituted or unsubstituted aryl; and Y is the second functional group. R may be an aliphatic chain, an alicyclic ring, or an aromatic ring. R may be substituted with a halogen, such as fluorine. X may be a primary, secondary or tertiary functional group. Y may be a primary, secondary or tertiary functional group.

R may have between 2 and 16 carbon atoms, preferably between 2 and 11 carbon atoms. R may have between 2 and 7 carbon atoms, preferably 6 carbon atoms. The carbon atoms may be alkyl, including aliphatic chains and alicyclic rings; or aryl, including aromatic rings. Organic precursors comprising a lower number of carbon atoms typically have higher vapour pressures. Such organic precursors are preferable for use in vapour deposition processes.

The organic precursor may be selected from the group comprising: 4-aminophenol, 6-mercapto-1-hexanol, and 11-mercaptoundecanoic acid.

The organic layer may be a self-assembled monolayer (SAM). The self-assembled monolayer may form spontaneously.

The organic layer may be a multilayer structure. That is, the organic layer may comprise more than one layer of the organic precursor. The passivation layer may comprise a plurality of organic layers. In some instances, a thicker organic layer, such as a multilayer, may help provide a passivation layer that exhibits improved oxidation resistance.

Step b) may comprise depositing the at least one organic layer onto the metallic surface by molecular vapour deposition.

Step c) may comprise depositing the at least one inorganic layer onto the organic layer by atomic layer deposition.

The inorganic layer may be a ceramic material. The ceramic material may be a metal oxide.

The inorganic layer may be selected from the group comprising: alumina (Al$_2$O$_3$); GeO$_2$, ZnO; SiO$_x$, SiO$_2$, Si$_3$N$_4$, TiO$_2$, ZrO$_2$, HfO$_2$, SnO$_2$, In$_2$O$_3$, or Ta$_2$O$_5$. The inorganic layer may provide an inorganic layer having a low gas permeation rate. The inorganic layer may suppress the oxidation of the underlying metallic surface effectively. The inorganic layer may be a multilayer structure. In some instances, an inorganic multilayer structure may help provide a passivation layer exhibiting improved oxidation resistance, whilst minimising the total thickness of the passivation layer. Without wishing to be bound by any theory or conjecture, it is believed that subsequent inorganic layers fill voids and/or defects in underlying inorganic layers, to provide a layer having a lower gas permeation rate, and hence beneficial passivation properties.

The inorganic layer may have a thickness of 0.1 nm to 10 nm. The inorganic layer may comprise between about 1 and 10 atomic layers. Such a thin film beneficially lowers material cost, fabrication time, and hence improves substrate throughput. Furthermore, such a thin film may be easier to remove and may lower the risk of contamination during subsequent processing steps.

The method may further comprise the step of:

aa) performing a reducing treatment on the metallic surface prior to step b). The reducing treatment may remove surface metal oxides from the metallic surface prior to step b). Any convenient reducing treatment may be suitable. The reducing treatment may be a hydrogen containing plasma treatment. The plasma used in the hydrogen containing plasma treatment may be formed from a H$_2$/Ar gas blend, or from pure H$_2$. Alternatively, the reducing treatment may comprise exposing the metallic surface to a chemical reducing agent, such as an acid or alcohol. The chemical reducing agent may be formic acid or ethanol.

The processing chamber may be purged with an inert gas prior to one or more of steps a), aa), b), and/or c). The processing chamber may be purged with an inert gas after one or more of steps a), aa), b), and/or c). The inert gas may be nitrogen (N$_2$), argon (Ar) or any other noble gas. A noble gas is any gas in group 18 of the periodic table. Purging the processing chamber with an inert gas helps to minimise the risk of formation of surface metal oxides prior to the complete formation of the passivation layer.

Step c) may comprise: sequentially introducing first and second gaseous reactants into the processing chamber to attach to or react with the second functional group thereby forming the inorganic layer. The first gaseous reactant may be trimethylaluminium (TMA). The second gaseous reactant may be water. Preferably, the first and second gaseous reactants are introduced into the processing chamber asynchronously. Optionally, the processing chamber is purged with an inert gas, such as nitrogen or argon, before the second gaseous reactant is introduced into the processing chamber. The optional purge step may remove by-product gases that might be present in the processing chamber.

Steps b) and c) may be performed in the same processing chamber. The substrate may remain in the processing chamber throughout steps a), aa), b) and/or c).

Steps b) and c) may be performed without a vacuum break between the steps. Steps a), aa), b) and/or c) may be performed without a vacuum break between the steps.

Steps b) and/or c) may be repeated. Steps b) and/or c) may be repeated to increase the thickness of the organic layer and inorganic layer. Steps b) and c) may be repeated cyclically to form a passivation layer comprising alternating organic and inorganic layers.

According to a second aspect of the invention there is a substrate comprising a passivation layer formed using the method of the first aspect of the invention.

The substrate may be a printed circuit board (PCB). The substrate may be a thermo-compression bonding substrate, a wire bonding substrate, or a solder bonding substrate. The substrate may be suitable for thermo-compression bonding, wire bonding, ball bonding, wedge bonding, solder bonding, or soldering.

According to a third aspect of the invention there is a method of at least partially removing or degrading the passivation layer from the substrate according to the second aspect by subjecting the substrate to a temperature between 100° C. and 260° C. Removing or degrading the passivation layer may include removing, degrading, decomposing or desorbing the passivation layer in full or in part from the substrate. The passivation layer may be at least partially removed, degraded or decomposed at a temperature between 100° C. and 150° C., optionally between 150° C. and 200° C., and optionally between 200° C. and 260° C. The passivation layer may be removed at a temperature between any combination of the limits of the temperatures provided above.

Whilst the invention has been described above, it extends to any inventive combination of the features set out above, or in the following description, drawings or claims.

BRIEF DESCRIPTION OF THE DRAWINGS

Embodiments of substrates and methods in accordance with the invention will now be described with reference to the accompanying drawings, in which.

DETAILED DESCRIPTION OF EMBODIMENTS

The present invention relates to a method of manufacturing a substrate having a copper, tin, silver or alloyed region or surface which is modified with a passivation layer. In particular, the passivation layer of the present invention is degradable at high temperatures and/or under mechanical stress.

Figure 1A:
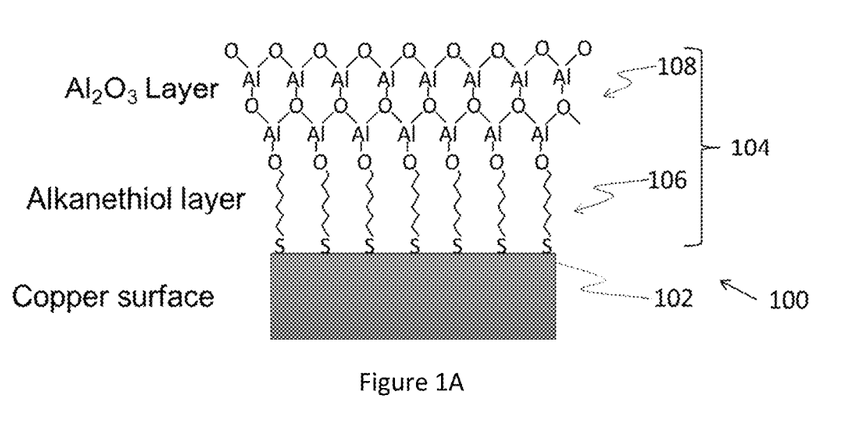
FIG. 1A is an illustration of a substrate having a passivation layer formed using the method according to a first embodiment.

FIG. 1 shows an illustration of a substrate 100 comprising a passivation layer formed using the method of the first embodiment. The substrate 100 comprises a copper surface 102, which is modified with a passivation layer 104. In other embodiments, the substrate may comprise a tin or silver surface, or an alloyed surface comprising one or more of copper, tin or silver. The copper surface 102 is an exposed surface of the substrate 100. The copper surface 102 may form part of an exposed region of the substrate 100. The copper surface 102 may form a complete layer on the surface of the substrate 100. In some embodiments, the substrate 100 is formed entirely of copper.

The passivation layer 104 comprises an organic layer 106 and an inorganic layer 108. The passivation layer 104 is a barrier layer having a low gas permeation rate, and therefore acts to inhibit oxidation of the copper surface 102. The organic layer 106 is formed from a bi-functional or multi-functional organic precursor. Multi-functional organic molecules are organic molecules having at least two functional groups. Typically, the two functional groups are separated by an aliphatic carbon chain or an alicyclic or aromatic ring.

In the present invention, the first functional group 111 is suitable for adsorbing to the copper surface 102. Typically, the first functional group 111 chemisorbs to the copper surface 102. The first functional group 111 provides good adhesion to the copper surface 102 to provide a stable passivation layer at room temperature. The first functional group 111 typically comprises: sulphur, nitrogen, silicon, oxygen, phosphorus, tellurium, and/or selenium. The first functional group 111 may be carboxyl (—COOH), primary amine (—NH$_2$), secondary amine, tertiary amine, thiol (—SH), diazole, triazole, disulphide, isocyanate, phosphonate, organoselenium, organotellurium, or organosilane. In the first embodiment, the first functional group is thiol (—SH). In the instance that the substrate has a copper surface, the first functional group preferably comprises sulphur, such as thiol (—SH) or disulphide; or nitrogen, such as amine, diazole, or triazole.

The second functional group 112 is suitable for attachment to or reaction with the inorganic layer 108. Typically, the second functional group 112 provides adsorption sites for subsequent films, such as the inorganic layer 108. In the first embodiment, the second functional group is hydroxyl (—OH). In other embodiments, the second functional group is carboxylic acid (—COOH).

The first and second functional groups are typically separated by an aliphatic carbon chain, or by an alicyclic or aromatic carbon ring. Typically the carbon chains comprise between 2 and 16 carbon atoms.

Figure 1B:
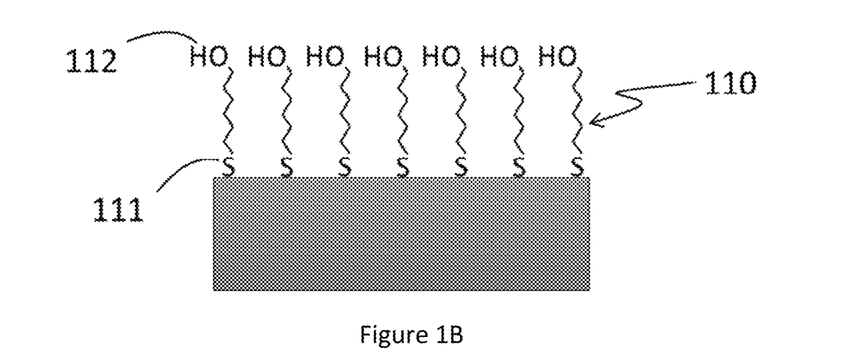
FIG. 1B is an illustration of a substrate modified with an organic layer only.

In the first embodiment, the organic layer is formed from the organic precursor 6-mercapto-1-hexanol. In alternative embodiments, the organic precursor is 4-aminophenol or 11-mercaptoundecanoic acid. Conveniently, the organic precursors adsorb to the copper surface 102, and form a self-assembled layer 110 (FIG. 1B). Typically the self-assembled layer is a self-assembled monolayer (SAM), however, the organic layer 106 may be a multi-layer film. The first functional group 111 typically chemisorbs to the copper surface. The second functional group 112 is typically available for attachment to or reaction with any layer that is added subsequently, such as the inorganic layer 108.

The inorganic layer 108 comprises a ceramic material, such as a metal oxide. The inorganic layer 108 is deposited on the organic layer 106. The second functional group 112 acts as an attachment site for the inorganic layer 108. In some embodiments, the inorganic layer 108 reacts with the second functional group 112. In the first embodiment, the inorganic layer 108 is composed of alumina ($Al_2O_3$). The alumina typically forms a three-dimensional amorphous layer. In other embodiments, the inorganic layer may be formed from $GeO_2$, $ZnO$, $SiO_x$, $SiO_2$, $Si_3N_4$, $TiO_2$, $ZrO_2$, $HfO_2$, $SnO_2$, $In_2O_3$, or $Ta_2O_5$.

By using a hybrid passivation layer 104 comprising an organic layer 106 and an inorganic layer 108, oxidation of the copper surface 102 is suppressed. Without wishing to be bound by any theory or conjecture, the inorganic layer 108 behaves as a barrier having a low gas permeation rate, which prevents oxygen from interacting with the substrate surface, thereby suppressing oxidation and corrosion. The organic layer 106 allows the passivation layer 104 to be selectively removable (at least in part) as desired by a user, for example at high temperatures or under mechanical stress. Full or partial removal of the organic layer 104 causes the passivation properties of the passivation layer 104 to be degraded. The full or partial removal of the organic layer 104 includes full or partial desorption, decomposition or degradation of the organic layer 104. The soft nature of the organic layer 106 facilitates the deformation of the inorganic layer 108 when under mechanical stress.

Figure 2:
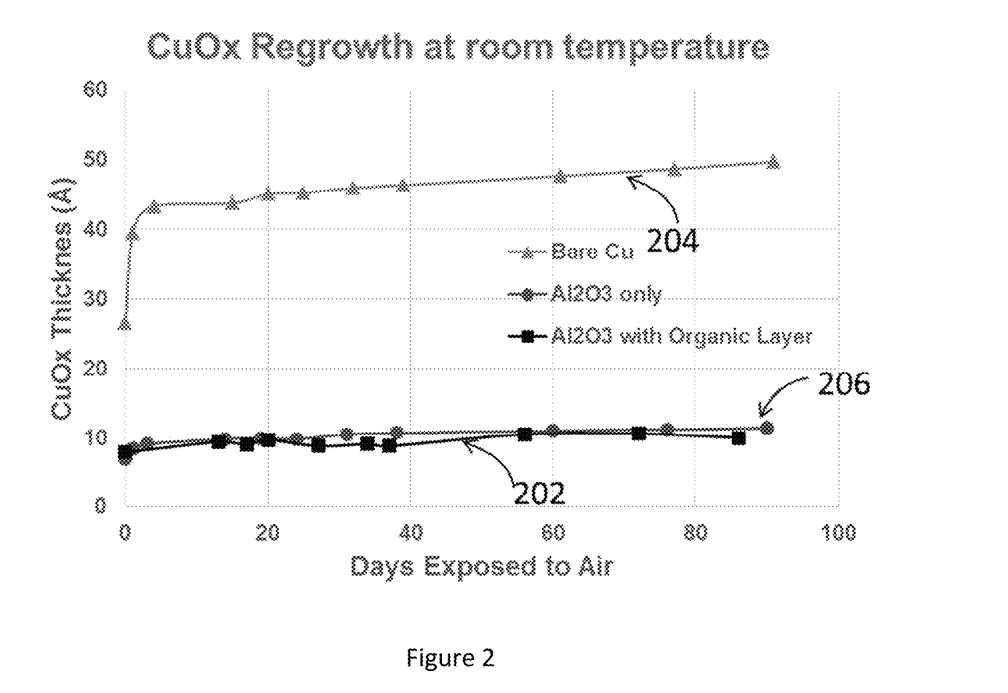
FIG. 2 is a plot showing the extent of copper oxide regrowth at room temperature against time for a substrate formed using the method of the first embodiment.

The substrate 100 modified with passivation layer 104 is suitable for resisting oxidation or corrosion of the underlying copper surface 102 at room temperature. FIG. 2 shows the extent of copper oxide regrowth at room temperature for a substrate manufactured using the method of the first embodiment (line 202). Comparative tests were also performed on an unmodified copper substrate (line 204), and on a copper substrate modified with alumina only (line 206). The thickness of copper oxide was measured using ellipsometry. The substrate formed using the method of the first embodiment showed no indication of oxide growth at room temperature for a period of over 3 months (line 202). The substrate of the first embodiment suppresses oxidation of the base copper surface, and exhibits anti-oxidation properties at room temperature. The copper substrate modified with alumina only (line 206) also suppressed copper oxide formation for a period of over 3 months. In contrast, the unmodified copper substrate (line 204) showed significant copper oxide regrowth in less than one day.

It is desirable for the passivation properties of the passivation layer 104 to be selectively degraded when desired by a user. The present inventors have realised that the passivation layer 104 of the first embodiment undergoes a change in state (or modification) at elevated temperatures such that the passivation properties of the passivation layer 104 are degraded. The change in state may include full or partial desorption, decomposition or degradation of the passivation layer 104 from the metallic surface.

Figure 3:
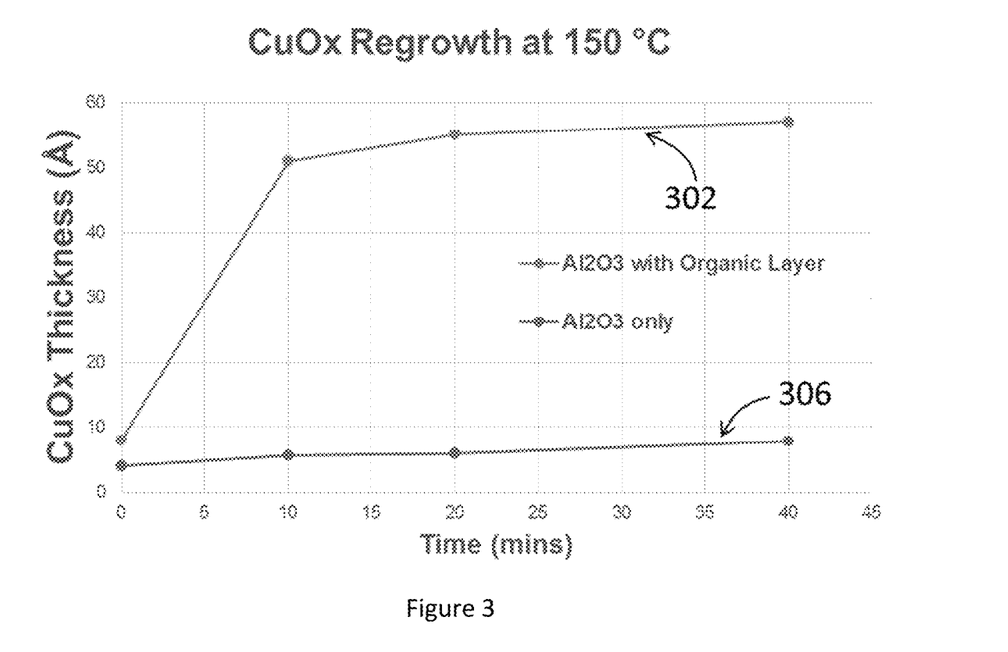
FIG. 3 is a plot showing the extent of copper oxide regrowth at 150° C. against time for a substrate formed using the method of the first embodiment.

FIG. 3 shows the extent of copper oxide regrowth of copper substrates at 150° C. for a substrate manufactured using the method of the first embodiment of the invention (line 302), and for a copper substrate modified with alumina only (line 306). Alumina is known to form a permanent passivation layer when deposited directly on a metallic surface. The alumina-coated substrate suppressed the oxidation of the copper substrate at 150° C. (line 306). In contrast, the modified substrate of the present invention (line 302) exhibited significant copper oxide regrowth after 10 minutes at 150° C.

Without wishing to be bound by any theory or conjecture, it is believed that at elevated temperatures, the passivation layer undergoes a change of state whereby the passivation properties of the passivation layer are degraded. The change of state may include full or partial degradation, decomposition or desorption of the organic layer from the copper surface. This effect is also observed on other metallic surfaces, including tin and silver surfaces, and alloyed surfaces comprising copper, tin and silver. After the change of state of the passivation layer 104, the surface of the substrate is no longer protected and oxidation of the metallic surface is able to occur.

The temperature sensitive passivation layer 104 beneficially allows the passivation properties of the layer 104 to be degraded as desired by a user. Typically, the passivation layer 104 is removed prior to or whilst forming an electrical connection. The temperature sensitive nature of the passivation layer 104 allows the layer 104 to be selectively removed at least in part during a soldering process. This beneficially reduces the number of processing steps required to remove the passivation layer, and also helps to minimise the risk of oxide regrowth occurring between the step of removing the passivation layer 104 and subsequent processing steps, such as forming an electrical connection.

Desorption, decomposition or degradation of the passivation layer 104 occurs more readily at a higher temperature. However, subjecting the substrate to an excessively high temperature may damage other components on the substrate. It is preferable to avoid such harsh processing conditions. Preferably, the change in state of the passivation layer 104, such as a desorption process, occurs at a temperature below the temperature used for soldering and/or thermo-compression bonding. Typically the temperature for soldering is about 260° C., although may be about 200° C. In the first embodiment the desorption process occurs at a temperature of about 150° C., and occurs at temperatures above 150° C. (FIG. 3). The desorption temperature is sufficiently low to allow the passivation properties of the passivation layer 104 to be degraded without damaging other components of the substrate.

Figure 4:
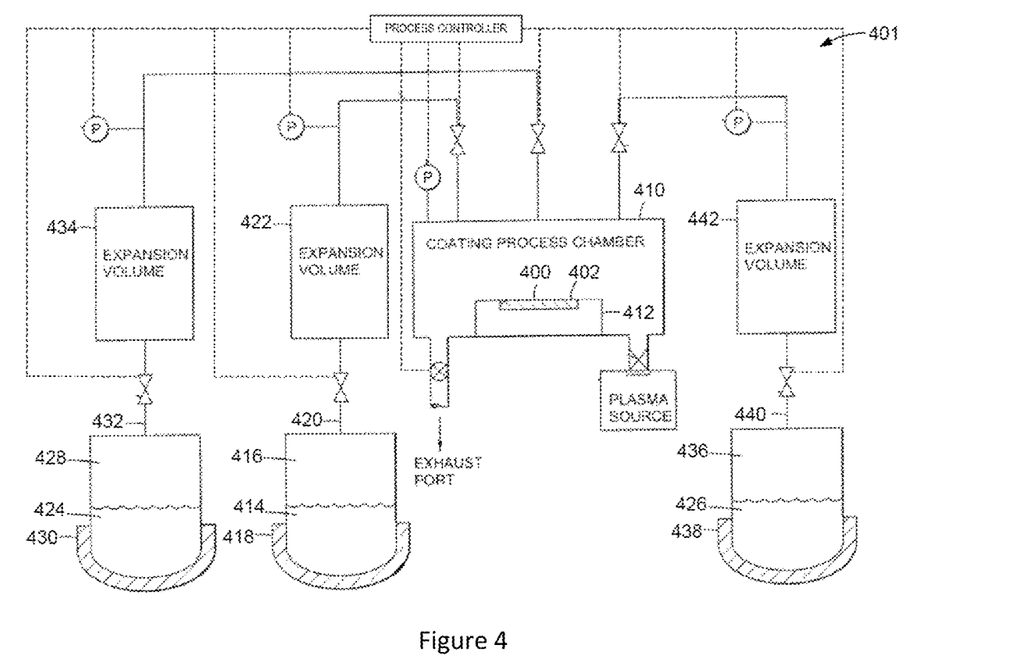
FIG. 4 is a schematic illustration of an apparatus suitable for forming a substrate having a passivation layer according to the method of the first embodiment.

The passivation layers of the present invention may be deposited using the apparatus described in patent document U.S. Pat. No. 9,725,805 B2, the entire contents of which are incorporated herein by reference. The apparatus used for deposition of the passivation layers is available from SPTS Technologies Limited, of Newport, UK (formerly Applied Microstructures, Inc. of San Jose, Calif.). The apparatus 401 shown schematically in FIG. 4 is suitable for performing methods according to the invention. This apparatus is specifically designed to provide a high degree of control in terms of quantity of reactants provided to the processing chamber for each individual process step, and in terms of the time and order at which these reactants are made available for the reaction.

Figure 5:
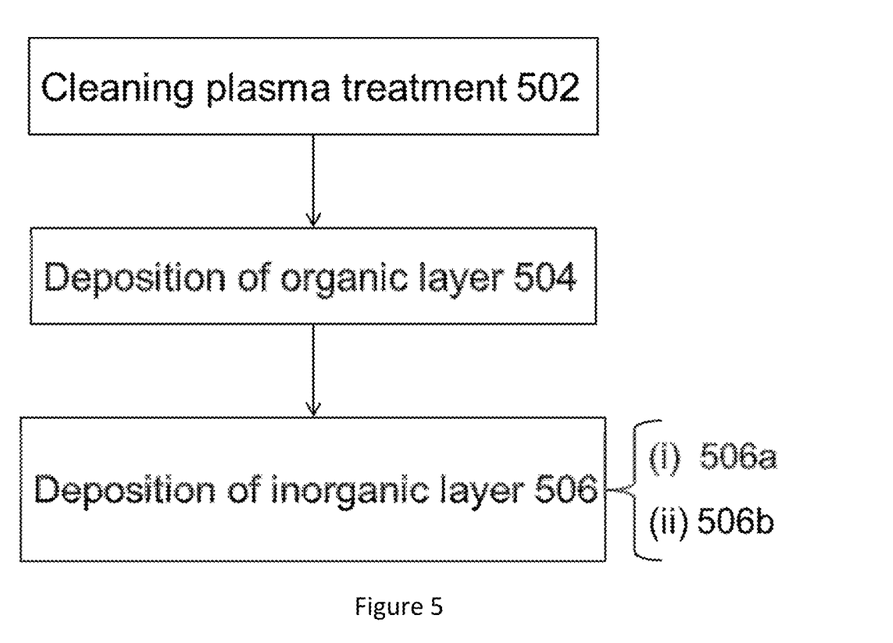
FIG. 5 is a flow diagram of the method according to the first embodiment.

FIG. 5 is a flow diagram representative of a procedure for depositing passivation layers according to the first embodiment. In general, the procedure comprises a cleaning treatment 502, an organic layer deposition step 504, and an inorganic layer deposition step 506. The deposition steps 504 and 506 may be repeated or cycled as necessary. All steps 502, 504, and 506 may conveniently be performed in the same processing chamber. This advantageously minimises the risk of contamination, and removes the need for transfer steps, such as transferring the substrate between processing modules. Consequently, the process improves throughput of substrate fabrication, whilst maintaining high quality.

A substrate 400 having a metallic surface 402 is loaded into a processing chamber 410. In one embodiment, the metallic surface is a copper surface. In other embodiments, the metallic surface is a tin or silver surface, or an alloyed surface comprising one or more of copper, tin or silver. The copper surface 402 is upward facing and rests on a substrate support 412. The substrate is first subjected to a cleaning treatment 502, to remove contaminants and metal oxides from the copper surface 402. Typically, the cleaning treatment 502 is a hydrogen plasma treatment. The plasma may be generated using a microwave, DC, or inductive RF power source, or combinations thereof. Alternatively, the cleaning treatment may comprise exposing the copper surface 402 to a chemical reducing agent, such as an acid or alcohol. The chemical reducing agent may be formic acid or ethanol.

After the pre-cleaning step 502 is complete, an organic layer formed from an organic precursor 414 is deposited onto the substrate 400 by a molecular vapour deposition process 504. In the first embodiment of the invention, the organic precursor is 6-mercapto-1-hexanol. The organic precursor 414 is held in a storage container 416, which may be heated by a heater 418 as necessary. The organic precursor vapour is introduced into the processing chamber 410 via transfer lines 420 and expansion chamber 422. The pressure in the processing chamber 410 during the organic layer deposition step 502 is typically between 0.02 and 2 Torr, preferably about 0.2 Torr. The processing chamber 410 is typically held at a temperature between 20° C. and 150° C.

The first functional group 111 of organic precursor spontaneously adsorbs to the copper surface 402 to form a self-assembled layer, such as a self-assembled monolayer (SAM). Forming a SAM ensures that the organic layer has a uniform thickness across the substrate surface. However, in some embodiments, the organic layer is a multi-layer film. Typically, the adsorption is chemisorption. In the first embodiment, the thiol functional groups of the 6-mercapto-1-hexanol precursor chemisorb to the copper surface 102 of the substrate to form a SAM. Typically, the first functional group 111 adsorbs to the copper surface in preference to the second functional group 112. In some embodiments, the second functional group 112 does not adsorb to the copper surface. As a result, the organic precursor is orientated so that the second functional group 112 is distal from the copper surface 402, thereby providing an adsorption or reactive site for subsequent processing steps. In the first embodiment, the hydroxyl group of the 6-mercapto-1-hexanol provides a reactive site for attachment to the inorganic layer.

An inorganic layer is subsequently deposited on top of the organic layer during the inorganic layer deposition step 506. The inorganic layer deposition step 506 is a further vapour deposition process, for example, atomic layer deposition or chemical vapour deposition. Any convenient type of vapour deposition may be used. Typically, the inorganic layer deposition step 506 is an atomic layer deposition process. An atomic layer deposition step conveniently allows individual layers of inorganic material to be deposited, which provides excellent uniformity across the substrate surface.

The inorganic deposition process 506 typically comprises the sub-steps of introducing a first gaseous reactant 424 into the processing chamber (step 506a); and introducing a second reactant 426 into the processing chamber (step 506b). The sub-steps may be repeated as many times as necessary to achieve the desired inorganic layer thickness. Typically, the sub-steps 506a and 506b are repeated between 1 and 10 times. In the first embodiment, the first and second gaseous reactants are trimethylaluminium (TMA) and water ($H_2O$) respectively. Typically, the processing chamber 410 is purged with an inert gas, such as $N_2$ or Ar, between each sub-step 506a and 506b.

Sub-step 506a comprises introducing the first gaseous reactant into the processing chamber 410. The first gaseous reactant 424 is held in storage container 428, which may be heated by heater 430 as necessary. The first gaseous reactant is introduced into the processing chamber 410 via transfer lines 432 and expansion chamber 434. The first reactant reacts with the available second functional groups 112 of the organic layer, such as hydroxyl and carboxylic acid, until no further reaction occurs. In this way, only a single atomic layer is deposited. In the first embodiment, TMA reacts with an available hydroxyl group (or carboxylic acid) on the organic layer to form an aluminium-based intermediate species (not shown).

The sub-step 506b comprises introducing the second gaseous reactant 426 into the processing chamber 410. The second gaseous reactant 426 is held in storage container 436, which may be heated by heater 438 as necessary. The second gaseous reactant is introduced into the processing chamber 410 via transfer lines 440 and expansion chamber 442. The second reactant reacts with the first reactant to form the inorganic layer. Typically, the inorganic layer is a ceramic layer and/or a metal oxide layer. Other convenient inorganic layers having a low gas permeation rate may be used. The inorganic layer may be composed of $Al_2O_3$, $GeO_2$, ZnO, $SiO_x$, $SiO_2$, $Si_3N_4$, $TiO_2$, $ZrO_2$, $HfO_2$, $SnO_2$, $In_2O_3$, or $Ta_2O_5$. In the first embodiment, water reacts with the aluminium-based intermediate species to form an amorphous alumina ($Al_2O_3$) layer. The alumina layer forms the inorganic layer.

Typically, the temperature of sub-steps 506a and 506b is maintained at a temperature between 35° C. and 250° C. Typically, the pressure of the processing chamber during the sub-steps 506a, 506b is about 0.05 Torr.

Each cycle of sub-steps 506a and 506b deposits a single atomic layer onto the substrate. Typically, each cycle of sub-steps 506a and 506b deposits a layer having a thickness of between 0.5 Å and 4.0 Å (i.e. 0.05 and 0.40 nm). The sub-steps 506a and 506b are typically repeated until the desired thickness of inorganic layer is achieved. Typically, the thickness of the inorganic layer is between about 0.1 nm and 10 nm. The present inventors have found that a 0.1-10 nm thick inorganic layer 108, deposited on an organic layer 106, can satisfactorily suppress the oxidation of a copper, tin, silver or alloyed surface 102.

What is claimed is:

1. A method of forming a passivation layer on a substrate, the method comprising the steps of:
   a) providing a substrate in a processing chamber, the substrate comprising a metallic surface, wherein the metallic surface is a copper, tin or silver surface, or an alloyed surface comprising one or more of copper, tin or silver;

b) depositing at least one organic layer onto the metallic surface by vapour deposition, the organic layer formed from an organic precursor comprising:

a first functional group comprising at least one of: oxygen, nitrogen, phosphorus, sulphur, selenium, tellurium, or silicon; and a second functional group selected from hydroxyl (—OH) or carboxyl (—COOH);

wherein the first functional group is adsorbed onto the metallic surface; and c) depositing at least one inorganic layer onto the organic layer by vapour deposition, wherein the second functional group acts as an attachment site for the inorganic layer.

2. The method according to claim 1 in which the first functional group is selected from the group consisting of carboxyl (—COOH), primary amine (—NH$_2$), secondary amine, tertiary amine, thiol (—SH), diazole, triazole, disulphide, isocyanate, phosphonate, organoselenium, organotellurium, and organosilane.

3. The method according to claim 1 in which the first functional group chemisorbs onto the metallic surface.

4. The method according to claim 1 in which the organic precursor has a structure of the form:

wherein X is the first functional group; R is substituted or unsubstituted alkyl, substituted or unsubstituted cycloalkyl or substituted or unsubstituted aryl; and Y is the second functional group.

5. The method according to claim 4 in which R has between 2 and 16 carbon atoms.

6. The method according to claim 5 in which R has between 2 and 7 carbon atoms.

7. The method according to claim 1 in which the organic precursor is selected from the group consisting of 4-aminophenol, 6-mercapto-1-hexanol, and 11-mercaptoundecanoic acid.

8. The method according to claim 1 in which the organic layer is a self-assembled monolayer (SAM).

9. The method according to claim 1 in which the organic layer is a multilayer structure.

10. The method according to claim 1 in which step b) comprises depositing the at least one organic layer onto the metallic surface by molecular vapour deposition.

11. The method according to claim 1 in which step c) comprises depositing the at least one inorganic layer onto the organic layer by atomic layer deposition.

12. The method according to claim 1 in which the inorganic layer is a ceramic material.

13. The method according to claim 1 in which the inorganic layer is selected from the group comprising: consisting of alumina (Al$_2$O$_3$); GeO$_2$, ZnO, SiO$_x$, SiO$_2$, Si$_3$N$_4$, TiO$_2$, ZrO$_2$, HfO$_2$, SnO$_2$, In$_2$O$_3$, and Ta$_2$O$_5$.

14. The method according to claim 1 in which the inorganic layer is a multilayer structure.

15. The method according to claim 1 in which the inorganic layer has a thickness of 0.1 nm to 10 nm.

16. The method according to claim 1 further comprising the step of:

aa) performing a reducing treatment on the metallic surface prior to step b).

17. The method according to claim 16 in which the reducing treatment is a hydrogen containing plasma treatment.

18. The method according to claim 16 in which the processing chamber is purged with an inert gas prior to one or more of steps a), aa), b), and/or c).

19. The method according to claim 1 in which step c) comprises:

sequentially introducing first and second gaseous reactants into the processing chamber to attach to or react with the second functional group thereby forming the inorganic layer.

20. The method according to claim 1 in which steps b) and c) are performed in the same processing chamber.

21. The method according to claim 20 in which steps b) and c) are performed without a vacuum break between the steps.

22. The method according to claim 1 in which steps b) and/or c) are repeated.

* * * * *